United States Patent
Frohberg et al.

(10) Patent No.: US 8,101,524 B2
(45) Date of Patent: Jan. 24, 2012

(54) TECHNIQUE FOR ENHANCING THE FILL CAPABILITIES IN AN ELECTROCHEMICAL DEPOSITION PROCESS BY EDGE ROUNDING OF TRENCHES

(75) Inventors: Kai Frohberg, Niederau (DE); Matthias Schaller, Boxdorf (DE); Massud Aminpur, Hopewell Junction, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 1322 days.

(21) Appl. No.: 11/122,591

(22) Filed: May 5, 2005

(65) Prior Publication Data
US 2006/0046495 A1 Mar. 2, 2006

(30) Foreign Application Priority Data
Aug. 31, 2004 (DE) .......................... 10 204 042 169

(51) Int. Cl.
*H01L 21/462* (2006.01)
(52) U.S. Cl. ........................ 438/706; 438/701
(58) Field of Classification Search .................. 438/706, 438/701
See application file for complete search history.

(56) References Cited

U.S. PATENT DOCUMENTS

| | | | |
|---|---|---|---|
| 6,117,782 A | 9/2000 | Lukanc et al. | 438/692 |
| 6,372,638 B1 * | 4/2002 | Rodriguez et al. | 438/640 |
| 6,731,006 B1 | 5/2004 | Halliyal et al. | 257/758 |
| 6,838,355 B1 * | 1/2005 | Stamper et al. | 438/409 |
| 6,893,974 B1 * | 5/2005 | Sedigh et al. | 438/714 |
| 6,916,697 B2 * | 7/2005 | Zhu et al. | 438/212 |
| 6,969,448 B1 * | 11/2005 | Lau | 204/192.17 |
| 7,001,836 B2 * | 2/2006 | Yang et al. | 438/624 |
| 2003/0003756 A1 | 1/2003 | Yu | 438/706 |
| 2003/0100176 A1 * | 5/2003 | Kim et al. | 438/624 |
| 2004/0266201 A1 * | 12/2004 | Wille et al. | 438/706 |
| 2006/0007453 A1 * | 1/2006 | Horak et al. | 356/625 |

FOREIGN PATENT DOCUMENTS
WO   WO 2004/055881 A1   7/2004

OTHER PUBLICATIONS

S. Wolf and R.N. Ttauber, Silicon Processing for the VLSI Era, vol. 1—Process Technology, Lattice Press, 1986, p. 523 & 524.*

* cited by examiner

*Primary Examiner* — Nadine G Norton
*Assistant Examiner* — Mahmoud Dahimene
(74) *Attorney, Agent, or Firm* — Williams, Morgan & Amerson, P.C.

(57) ABSTRACT

During the formation of a metal line in a low-k dielectric material, an upper portion of a trench formed in a capping layer and the low-k dielectric material is treated to provide enlarged tapering or corner rounding, thereby significantly improving the fill capabilities of subsequent metal deposition processes. In one particular embodiment, an additional etch process is performed after etching through the capping layer and the low-k dielectric layer and after resist removal.

11 Claims, 4 Drawing Sheets

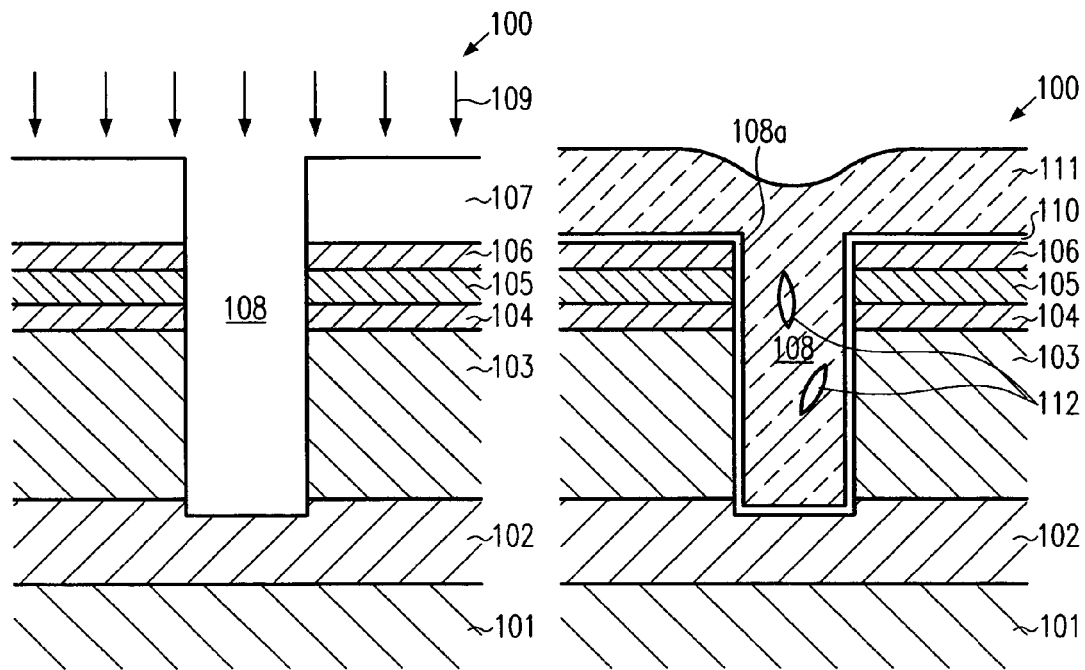
Fig.1a
(prior art)
Fig.1b
(prior art)
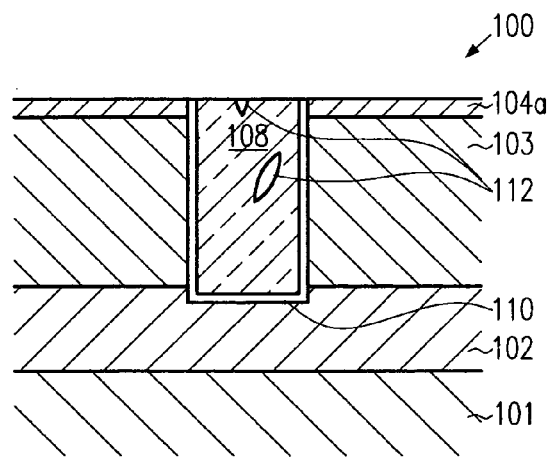
Fig.1c
(prior art)

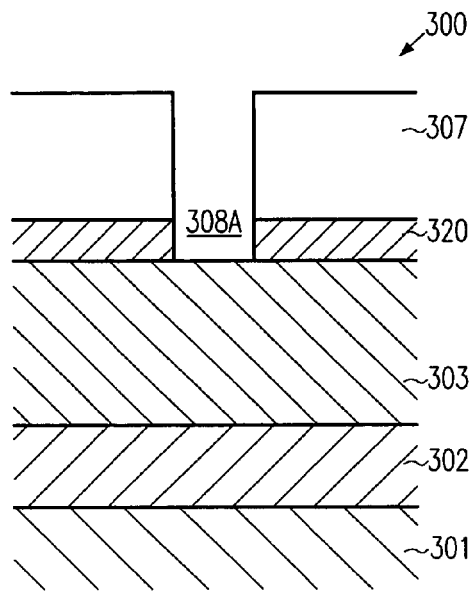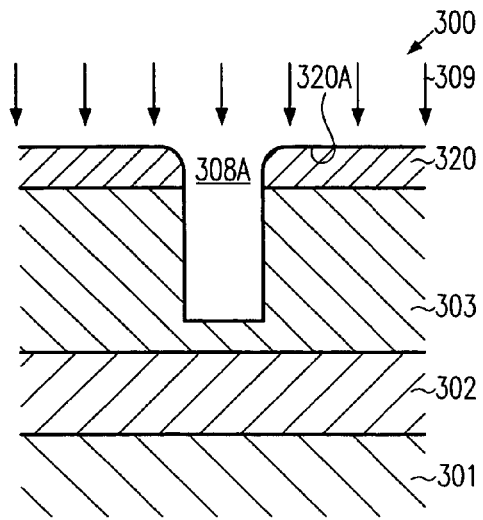
Fig.3a    Fig.3b
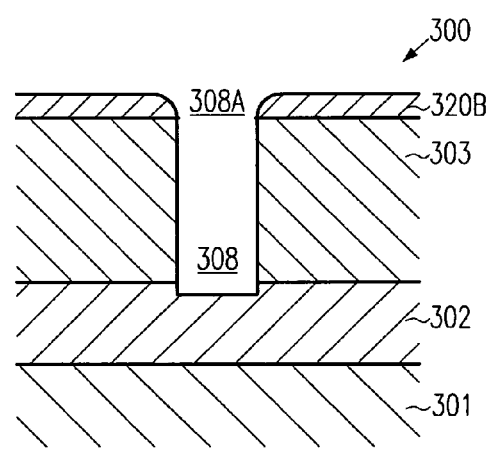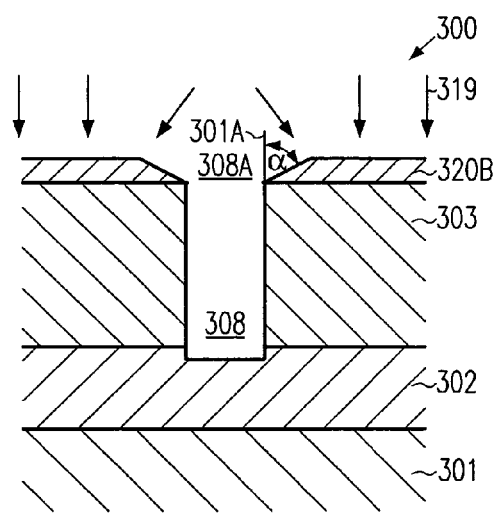
Fig.3c    Fig.3d

TECHNIQUE FOR ENHANCING THE FILL CAPABILITIES IN AN ELECTROCHEMICAL DEPOSITION PROCESS BY EDGE ROUNDING OF TRENCHES

BACKGROUND OF THE INVENTION

1. Field of the Invention

Generally, the present invention relates to the formation of integrated circuits, and, more particularly, to the formation of metallization layers including highly conductive metals, such as copper, embedded into a dielectric material having a low permittivity to enhance device performance.

2. Description of the Related Art

In an integrated circuit, a very large number of circuit elements, such as transistors, capacitors, resistors and the like, are formed in or on an appropriate substrate, usually in a substantially planar configuration. Due to the large number of circuit elements and the required complex layout of the integrated circuits, the electrical connection of the individual circuit elements are generally not established within the same level on which the circuit elements are manufactured. Typically, such electrical connections are formed in one or more additional "wiring" layers, also referred to as metallization layers. These metallization layers generally include metal-containing lines, providing the inner-level electrical connection, and also include a plurality of inter-level connections, also referred to as vias, filled with an appropriate metal. The vias provide electrical connection between two neighboring stacked metallization layers, wherein the metal-containing lines and vias may also be commonly referred to as interconnects.

Due to the continuous shrinkage of the feature sizes of circuit elements in modem integrated circuits, the number of circuit elements for a given chip area, that is the packing density, also increases, thereby requiring an even larger increase in the number of electrical interconnections to provide the desired circuit functionality. Therefore, the number of stacked metallization layers may increase and the dimensions of the individual lines and vias may be reduced as the number of circuit elements per chip area becomes larger. The fabrication of a plurality of metallization layers entails extremely challenging issues to be solved, such as mechanical, thermal and electrical reliability of a plurality of stacked metallization layers. As the complexity of integrated circuits advances and brings about the necessity for conductive lines that can withstand moderately high current densities, semiconductor manufacturers are increasingly replacing the well-known metallization metal aluminum with a metal that allows higher current densities and hence allows a reduction in the dimensions of the interconnections and thus the number of stacked metallization layers. For example, copper is a metal generally considered to be a viable candidate for replacing aluminum, due to its superior characteristics in view of higher resistance against electromigration and significantly lower electrical resistivity when compared with aluminum. Despite these advantages, copper also exhibits a number of disadvantages regarding the processing and handling of copper in a semiconductor facility. For instance, copper may not be efficiently applied onto a substrate in larger amounts by well-established deposition methods, such as chemical vapor deposition (CVD), and also may not be effectively patterned by the usually employed anisotropic etch procedures. Consequently, in manufacturing metallization layers including copper, the so-called damascene technique (single and dual) is therefore preferably used, wherein a dielectric layer is first applied and then patterned to receive trenches and/or vias which are subsequently filled with copper or copper alloys.

The process of filling copper or copper alloys into highly scaled openings, such as trenches or vias having aspect ratios (depth/diameter) of approximately 5 or even more for sophisticated integrated circuits, is an extremely challenging task for process engineers. As previously noted, copper and its respective alloys may not efficiently be deposited by chemical or physical vapor deposition and hence copper-based metals are typically deposited by electrochemical techniques, such as electroless plating or electroplating. Although electro-plating techniques for depositing copper are well established in the field of manufacturing integrated circuit boards, completely new deposition techniques have been developed for the formation of copper-based metallization layers in accordance with the damascene technique regarding fill behavior during the copper deposition, in which trenches and vias are filled substantially from bottom to top with a minimum number of defects, such as voids within the trenches and vias. After the deposition of the copper or copper-based metal, the excess material deposited on areas outside of the trenches and vias has to be removed, which is currently accomplished by chemical mechanical polishing (CMP), possibly in combination with electrochemical etch techniques.

In highly advanced semiconductor devices, the dielectric material in which the copper-based metal is embedded typically comprises a so-called low-k material, that is a material having a relative permittivity significantly lower than "conventional" dielectric materials, such as silicon dioxide, silicon nitride and the like, so that, in general, the relative permittivity of the low-k material is 3.0 or even less. However, the reduced permittivity usually comes along with a significantly reduced mechanical strength and stability. Therefore, in typical damascene techniques for forming low-k metallization layers of advanced semiconductor devices, a capping layer is provided that ensures the mechanical integrity of the low-k dielectric material, thereby acting as a polish stop layer during the removal of the excess metal.

With reference to FIGS. 1a-1c, a typical conventional process flow will now be described in more detail to more clearly demonstrate the problems involved in forming highly scaled copper lines in a low-k dielectric material.

FIG. 1a schematically shows a cross-sectional view of a semiconductor device 100 comprising a substrate 101, which may be provided in the form of a bulk silicon substrate, a silicon-on-insulator (SOI) substrate and the like, wherein the substrate 101 may also represent a device layer having formed therein individual circuit elements, such as transistors, capacitors, lines, contact portions and the like. For convenience, any such circuit elements are not shown in Figure la. The device 100 further comprises a dielectric layer 102 formed above the substrate 101, wherein the layer 102 may represent a dielectric material enclosing the individual circuit elements, or the layer 102 may represent a portion of a lower-lying metallization layer, in which any metal-filled vias (not shown) may be embedded. Depending on the specific design of the device 100, or the function of the layer 102, it may be comprised of a conventional dielectric material such as silicon dioxide, silicon nitride, or it may comprise a low-k dielectric material such as, for instance, hydrogen-enriched silicon oxycarbide (SiCOH).

A further dielectric layer 103 is formed above the layer 102 and is comprised of a low-k dielectric material which helps to reduce the parasitic capacitance between adjacent metal lines to be formed in the low-k dielectric layer 103. As previously pointed out, the mechanical strength of the layer 103 is typically reduced compared to materials such as silicon dioxide and silicon nitride and therefore usually a capping layer 104 is provided on top of the layer 103 to provide the integrity of the low-k dielectric layer 103 in subsequent manufacturing processes. Furthermore, a dielectric layer 105 designed to act as an anti-reflective coating (ARC) layer is formed on the capping layer 104 followed by a further capping layer 106 that is substantially devoid of any nitrogen. A resist mask 107 is formed above the layer 106 and has formed therein an opening that substantially corresponds to a trench 108 formed in the layers 106, 105, 104 during an etch process 109.

Typically, the layer 105 may comprise nitrogen, for instance in the form of silicon oxynitride, which may adversely affect the performance of the resist mask 107, as modern photoresists are extremely affected by nitrogen and nitrogen compounds in that the sensitivity to the exposure wavelength is significantly reduced owing to a chemical reaction in the photoresist caused by the presence of nitrogen and nitrogen radicals. This effect, referred to as resist poisoning, has long been under-estimated but is gaining in importance as the dimensions of the trench 108 are continuously scaled down. The effect of resist poisoning may result in incompletely removed resist portions in the corresponding opening of the resist mask 107, thereby finally causing irregularities during the etch process for the trench 108. Consequently, the capping layer 106 is provided, for instance in the form of silicon dioxide, to act as a buffer layer between the resist mask 107 and the ARC layer 105.

A typical process flow for forming the semiconductor device 100 as shown in FIG. 1a may comprise the following processes. After the completion of any circuit elements within the substrate 101, the dielectric layer 102 may be deposited by well-established deposition recipes based on plasma enhanced chemical vapor deposition (PECVD). For example, the layer 102 may be comprised of silicon dioxide or fluorine-doped silicon dioxide and hence deposition recipes on the basis of TEOS may be employed to form the layer 102. It should be noted that any additional etch stop layers and the like may be included in the layer 102. Similarly, depending on process requirements, dielectric etch stop layers or barrier layers may be formed on an upper portion of the layer 102.

Thereafter, the low-k dielectric material is deposited to form the layer 103. For instance, SiCOH is a well-established low-k material that may be deposited by PECVD on the basis of precursors, such as 3 MS (trimethylsilane), 4 MS and the like. However, other materials may be used which may be applied on the basis of spin-on techniques and the like.

Thereafter, the capping layer 104 is formed, for instance in the form of silicon dioxide, by means of well-established PECVD techniques based on precursor materials such as silane and the like. Next, the ARC layer 105 is deposited on the basis of PECVD techniques, wherein the thickness and the material composition is selected to provide, in combination with the layer 106, the desired optical behavior as an anti-reflective coating layer. For instance, the index of refraction of the ARC layer 105 may be adjusted by adjusting the amount of nitrogen during the deposition of silicon dioxide. Thereafter, the capping layer 106 is deposited, for instance in the form of silicon dioxide, by PECVD.

Next, the resist mask 107 is formed by applying a photoresist layer, exposing the layer to a specified exposure wavelength and developing the exposed layer to provide the patterned mask layer 107. Thereafter, the etch process 109 is performed wherein, in an initial phase, the exposed portion of the layer 106, the layer 105 and the layer 104 are removed and, in a subsequent process, the low-k dielectric material is removed to form the trench 108 having moderately steep sidewalls due to the highly anisotropic nature of the etch process.

It should be noted that the initial phase for etching through the layers 106, 105, 104 may require a different etch chemistry compared to the main etch for removing the low-k dielectric material due to differences in material composition, density and the like. It should also be noted that during the etch process 109, a portion of the resist mask 107 is also consumed, wherein, typically, a removal rate for the resist mask 107 is reduced compared to the materials of the layers 103, 104, 105, 106. Otherwise the resist mask 107 may be provided with a sufficient thickness to "overcompensate" the material loss and to serve as an etch mask during the entire etch process if the removal rates are comparable. Thereafter, the remaining photoresist is removed and the manufacturing process is continued with the deposition of conductive barrier layers, a seed layer and the electrochemical deposition of the bulk metal by means of, for example, electroplating.

FIG. 1b schematically shows the semiconductor device 100 after the above-described process sequence. Hence, the device 100 comprises a conductive barrier layer 110, which may include one or more sub-layers on the basis of materials reducing the out-diffusion of copper into the surrounding dielectric material and enhancing the adhesion of copper within the low-k dielectric layer 103. Moreover, a copper layer or a copper alloy layer 111 is formed above the layer 110 and within the trench 108. During the deposition of the layer 111, the composition and the kinetics within an electrolyte bath are controlled to yield a highly non-conformal deposition behavior so that, in principle, the copper or copper-based alloy is deposited from bottom to top within the trench 108. For a trench having a high aspect ratio, i.e., the ratio of trench depth to trench width, even slight overhangs at the trench edge 108a may lead to the creation of defects, such as voids 112 within the trench 108, which may finally lead to reliability concerns of the metal-filled trench 108.

FIG. 1c schematically shows the device 100 with the excess material of the layer 111 and the layers 110 removed and also with the layers 106 and 105 removed, which may be accomplished, as previously explained, at least partially by chemical mechanical polishing, during which the layer 104 also acts as a stop layer. Consequently, the layer 104 is also reduced in thickness and is indicated as 104a. Due to the voids 112, the reliability of metallization layers is significantly affected since the corresponding line, i.e., the metal-filled trench 108, may have a reduced conductivity and may also exhibit increased current or temperature-induced material transport, i.e., electromigration, at elevated current densities as are typically encountered in highly scaled devices.

In view of the situation described above, there exists a need for an improved technique which overcomes, or at least reduces the effects of, one or more of the problems set forth above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of an opening within a layer stack including a low-k dielectric material, which may then be filled with a metal in a more reliable manner in that an upper portion of the opening is rounded or tapered by exposing a dielectric capping layer formed above the low-k material during and/or after etching through the low-k dielectric material. By this additional exposure to an etchant, the slope of the upper trench portion, at least within a portion of the capping layer, is significantly increased compared to the conventional anisotropic etch process that provides only marginal corner rounding. Consequently, the deposition kinetics during an electrochemical deposition process for filling the opening with a metal is significantly improved, thereby reducing or avoiding the formation of voids within the metal-filled opening.

According to one illustrative embodiment of the present invention, a method comprises forming a dielectric layer stack of a metallization layer of a semiconductor device above a substrate, wherein the dielectric layer stack includes a low-k dielectric layer and a capping layer. The method further comprises performing a first etch process to form an opening in the dielectric layer stack and performing a second etch process to form a tapered portion at an upper portion of the opening. Finally, a metal is filled into the opening having the tapered portion by an electrochemical deposition process.

According to another illustrative embodiment of the present invention, a method comprises forming a low-k dielectric layer of a metallization layer of a semiconductor device above a substrate and forming a capping layer on the low-k dielectric layer. Moreover, an opening of specified dimensions is formed in the capping layer through a surface thereof. Finally, an etch process is performed to etch the low-k dielectric layer through the opening, while the surface is exposed at least for a specified time period during the etch process.

BRIEF DESCRIPTION OF THE DRAWINGS

The invention may be understood by reference to the following description taken in conjunction with the accompanying drawings, in which like reference numerals identify like elements, and in which:

FIGS. 1a-1c schematically show cross-sectional views of a semiconductor device during various manufacturing stages in forming a metal-filled trench in a low-k dielectric layer according to a conventional single damascene technique;

FIGS. 3a-3d schematically show some of the manufacturing processes for additionally rounding upper trench portions during the fabrication of a metal line in a low-k dielectric material in accordance with still further illustrative embodiments of the present invention.

Figures 2A, 2B:
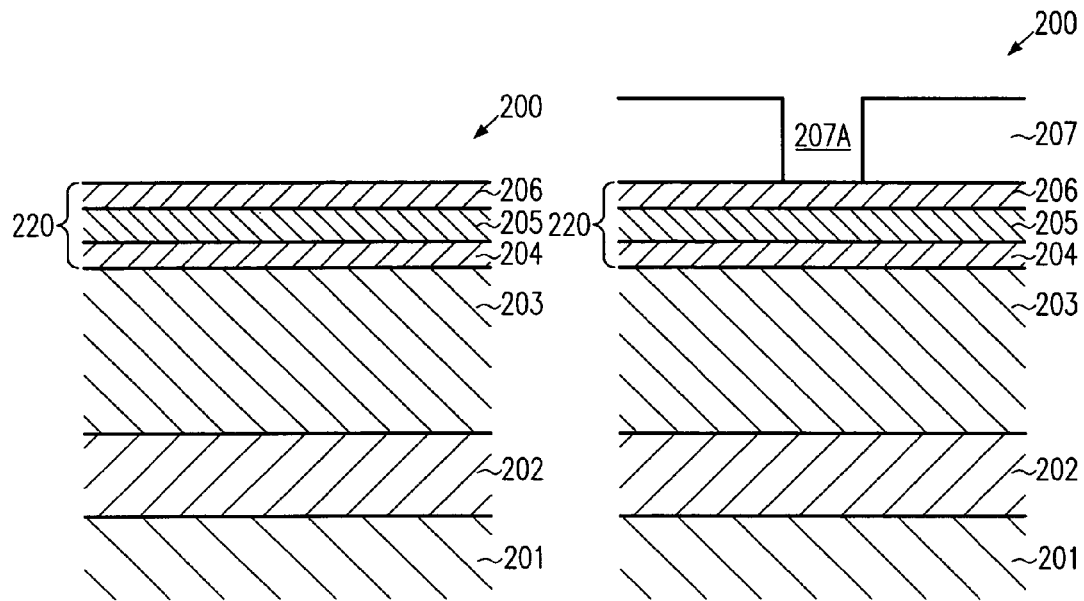
FIGS. 2a-2g schematically show cross-sectional views of a semiconductor device having a low-k dielectric metallization layer during various manufacturing stages in accordance with illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention is based on the concept that the fill capabilities of currently used electrochemical deposition recipes and of future deposition recipes may significantly be improved by modifying the shape of trenches and vias formed in low-k dielectric materials to receive a corresponding metal such as copper or copper alloys. As previously explained with reference to FIGS. 1a-1c, the low-k dielectric material is typically covered by one or more capping layers that may be advantageous in view of mechanically strengthening the low-k dielectric material, providing enhanced optical characteristics during the photolithography and avoiding or suppressing any resist poisoning effects. In the conventional process, the anisotropic etching for forming the opening is performed on the basis of a resist mask, which is maintained throughout the entire etch process for forming the trench or via in the low-k dielectric material. Due to the additional capping layers, the aspect ratio of the opening to be filled with the metal is even greater as compared to the actual design dimensions of the metal-filled line or via to be formed in the low-k dielectric material, while only a small amount of corner rounding (not shown in FIG. 1b) is achieved due to the anisotropic nature of the etch process. By intentionally increasing a tapered or a rounded portion of the opening according to the present invention in some embodiments, in combination with a material removal of the one or more capping layers, the start conditions for the subsequent fill processes, i.e., the deposition of conductive barrier layers by sputter techniques, CVD techniques, atomic layer deposition (ALD) techniques and the like, the deposition of a seed layer by sputter techniques, electrochemical techniques and the like, and the subsequent deposition of the bulk metal by electroless plating or electroplating, may significantly be relaxed, thereby providing the potential for more reliably filling vias and trenches of highly scaled semiconductors such as devices of the 90 nm and 65 nm technology node. It should be appreciated, however, that the principles shown herein may also be advantageously applied to devices of less critical applications, since also in this case the constraints for the metal deposition processes are significantly relaxed, thereby reducing process complexity. With reference to the accompanying drawings, further illustrative embodiments of the present invention will now be described in more detail.

FIG. 2a schematically shows a semiconductor device 200 that is to represent a semiconductor device having formed therein a plurality of circuit elements (not shown) and possibly one or more metallization layers which comprise, at least partially, a low-k dielectric material, wherein the term "low-k" is to be understood to indicate a relative permittivity of approximately 3.0 and less. Moreover, the following specification refers to a trench that is to be formed in a low-k dielectric material, since, in sophisticated semiconductor devices, at least the metal lines are embedded in a low-k dielectric material. It should be appreciated, however, that the principle of corner rounding may also be applied to vias when they have to be formed in a low-k dielectric material.

The semiconductor device 200 comprises a substrate 201, which may represent any appropriate substrate, such as a bulk silicon substrate, an SOI substrate, any other insulating substrate having formed thereon an appropriate semiconductor layer or any other semiconductor substrate, such as III-V semiconductors or II-VI semiconductors, and the like. In particular embodiments, the substrate 201 represents a bulk silicon substrate or an SOI substrate. Moreover, as previously explained with reference to FIG. 1a, the substrate 201 is to represent a substrate having formed thereon a plurality of circuit elements such as transistors, capacitors and the like, and may also include one or more lower lying metallization layers.

Formed above the substrate 201 is a layer 202 which may represent an interlayer dielectric material having formed therein any contact portions, vias and the like as are necessary to provide the electrical connection to any circuit elements formed in the substrate 201. For convenience, the layer 202 is illustrated as a single layer, whereas, in actual devices, one or more sub-layers may be included, such as etch stop layers, dielectric barrier layers and the like. Moreover, any contact portions, vias and the like are not shown. A dielectric layer 203 comprised of a low-k dielectric material, such as hydrogen enriched silicon oxycarbide (SiCOH), HSQ, MSQ, SILK and the like, is formed above the layer 202.

Next, a capping layer 220 is formed on the low-k dielectric layer 203 wherein the capping layer 220 may be comprised of any appropriate dielectric material to enhance the mechanical strength of the layer 203 in subsequent processes as well as to provide the required optical behavior during subsequent photolithography processes. Moreover, the capping layer 220 may be comprised of a material composition that reduces or eliminates resist poisoning effects during the subsequent photolithography. For example, the capping layer 220 may be comprised of silicon, oxygen and carbon wherein the optical characteristics of the capping layer 220 may be defined by the amount of carbon within the silicon dioxide based layer.

In other embodiments, the capping layer 220 may comprise two or more sub-layers to obtain, in combination, the desired behavior with respect to optical and mechanical characteristics. In one embodiment, the capping layer 220 may comprise a first sub-layer 204 comprised of silicon dioxide followed by an ARC layer 205 comprised of silicon oxynitride, and a second sub-layer 206 that may be comprised of silicon dioxide. In other cases, the number of sub-layers and the material composition thereof may vary depending on process and device requirements. For instance, the first sub-layer 204 may be comprised of silicon nitride or the ARC layer 205 may be modified to also act as a CMP stop layer during a CMP polish process in a later manufacturing stage, thereby rendering the sub-layer 204 obsolete. Similarly, the sub-layer 206 may be comprised of any other nitrogen-free material compositions, if the ARC layer 205 comprises nitrogen, to avoid the out-diffusion of nitrogen and nitrogen compounds. For instance, the second sub-layer 206 may be comprised of silicon carbide or silicon oxycarbide and the like.

A typical process flow for forming the device 200 as shown in FIG. 2a may comprise the following processes. After the formation of any circuit elements in the substrate 201 by well-approved process techniques involving enhanced photolithography, implantation techniques, etch processes and deposition techniques for circuit elements having critical dimensions of, for example, 50 nm and even less, the layer 202 is formed in accordance with well-proved techniques. For instance, one or more deposition processes may be performed to provide the required etch stop layers, barrier layers and inter-layer dielectrics, as is required for the further processing. During one or more of the deposition sequences, a planarization step may be performed by CMP, followed by one or more further deposition processes.

Thereafter the low-k dielectric layer 203 is formed by deposition and/or spin-on techniques, depending on the type of material used for the low-k dielectric layer 203. For example, SiCOH may be deposited by PECVD from precursors such as 3 MS, 4 MS and the like. Thereafter, the capping layer 220 is formed by PECVD techniques, wherein well-established process recipes may be used depending on the material composition of the capping layer 220. For example, the layers 204, 205 and 206 may be formed by PECVD as is also described with reference to FIG. 1a. If the capping layer 220 is provided as a single layer or as a double layer, corresponding well-established recipes for forming a substantially nitrogen-free single layer or double layer may be used. For instance, the capping layer 220 or a sub-layer thereof may be comprised of carbon-enriched silicon dioxide.

FIG. 2b schematically shows the semiconductor device 200 having formed thereon a resist mask 207. The resist mask 207 comprises an opening 207a of specified dimensions to correspond to an opening, such as a trench, that is to be formed in the capping layer 220 and the low-k dielectric layer 203. The resist mask 207 may be patterned in accordance with well-established photolithography techniques, wherein the capping layer 220 provides the required anti-reflective behavior and also suppresses a contamination of the resist with nitrogen and nitrogen compounds. For example, in the embodiment shown, the ARC layer 205 my be formed with respect to its optical characteristics and its layer thickness to minimize, in combination with the sub-layer 206, the back reflection during the exposure of the photoresist that is irradiated by a specific exposure wavelength.

Figures 2C, 2D:
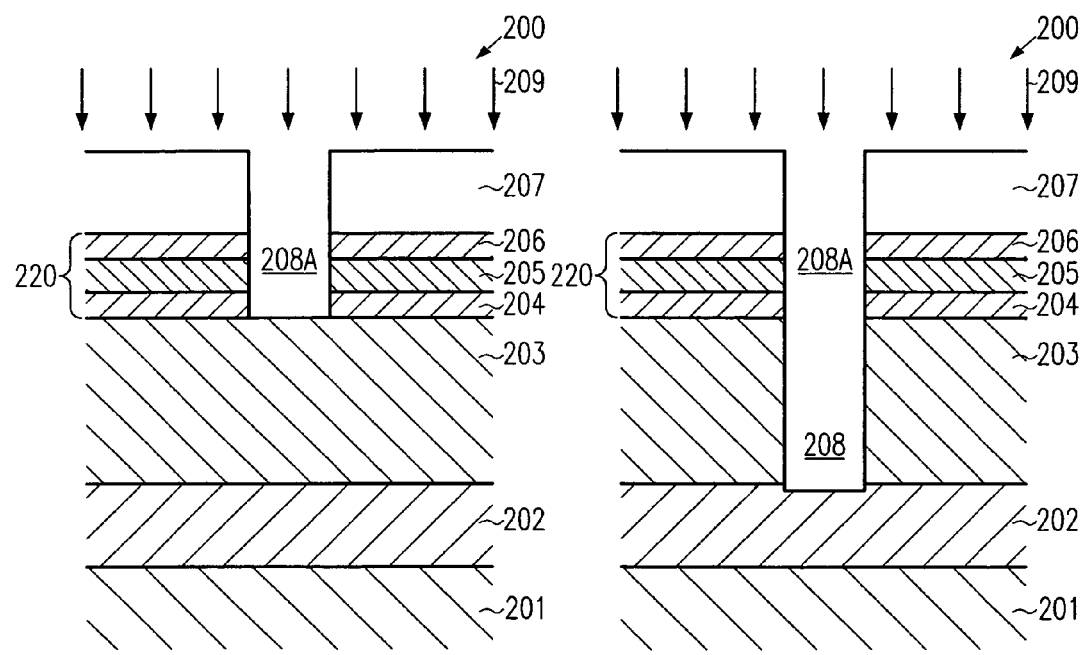

FIG. 2c schematically shows the semiconductor device 200 during a first step of a first etch process 209 for forming an upper portion 208a of an opening to be formed in the capping layer 220 and the low-k dielectric layer 203. During the first step of the etch process 209, the etch atmosphere is selected to effectively etch through the capping layer 220, wherein appropriate etch recipes are well known in the art for a plurality of materials. For instance, well-established plasma etch recipes for silicon dioxide may be used to etch through the sub-layer 206, the ARC layer 205 and the sub-layer 204. Thereafter, a second step of the etch process 209 may be performed to etch through the low-k dielectric material 203, wherein the second step may use the same or a different etch recipe, depending on the material composition of the layer 203, wherein the etch process may be performed in the same etch reactor or a different etch tool may be used.

FIG. 2d schematically shows the semiconductor device 200 after completion of the second step of the etch process 209, wherein an opening 208 is formed in the low-k dielectric layer 203 having the upper portion 208a in the capping layer 220. It should be appreciated that the layer 202 may comprise an etch stop layer, i.e., a material that has a significantly lower removal rate compared to the dielectric material of the layer 203 during the second step of the etch process 209 so that the etch front may reliably be stopped within the layer 202. Moreover, during the etch process 209, the resist mask 207 may also be attacked so that a significant amount of the thickness of the resist mask 207 may also be removed during the etch process 209. In particular, a certain degree of corner rounding in the resist layer and at the upper portion 208a (not shown) may occur as in the conventional process. Thereafter, the remaining resist mask 207 may be removed by well-established resist removal techniques.

Figures 2E, 2F:
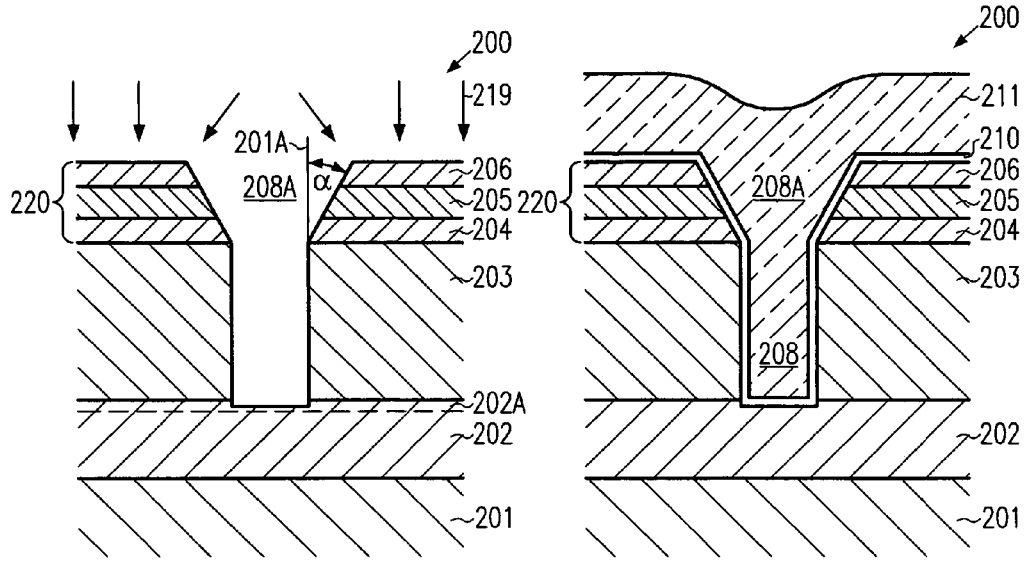
Figure 2G:
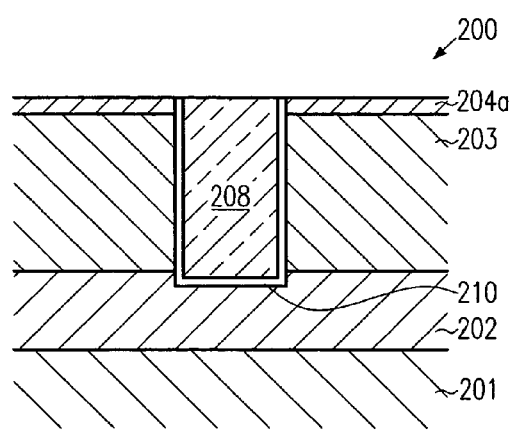

FIG. 2e schematically shows the semiconductor device 200 during a second etch process 219 that is performed to additionally round corners of the opening 208, at least at the upper portion 208a, thereby creating a substantially tapered trench opening. For example, the capping layer may have a thickness of approximately 60-100 nm and the tapering may, in some embodiments, extend substantially down to the layer 203. For the above dimensions, an average angle α of the tapered portion of the upper portion 208a may range from approximately 10-50 degrees with respect to direction 201a perpendicular to the surface of the substrate 201.

In some embodiments, the second etch process 219 may be performed as a substantially anisotropic etch process based on an etchant that is also used for etching through the capping layer 220 during the first step of the etch process 209. Since typically an etch stop layer is provided in the layer 202, indicated as 202a in FIG. 2a, the second etch process 219 may not unduly remove material from the layer 202 during the etch process 219 for the additional corner rounding at the upper portion 208a. In other embodiments, the etch atmosphere for the process 219 is established to have a reduced anisotropic character for the plasma atmosphere compared to the highly anisotropic process 209, for instance by reducing a bias power applied to the substrate 201 to obtain a less directed ion bombardment and thus a more isotropic behavior, thereby promoting the corner rounding effect of the second etch process 219. In one particular embodiment, the second etch process 219 may be performed on the basis of a plasma containing argon, oxygen and $CHF_3$.

In addition to the type of materials in the layers 203 and 220, the process parameters of the second etch process 219 may also depend on structural specifics of the device 200, such as aspect ratio of the opening 208 prior to the beginning of the second etch process 219, the spacing between neighboring openings 208 and the like. Hence, the desired degree of corner rounding or tapering may be derived from one or more test measurements, which may include scatterometry measurements and/or electron microscopic measurements to determine a correlation between at least one etch parameter and the degree of corner rounding for a given trench geometry. In particular embodiments, the process parameters of the second etch step 219 may be obtained on the basis of measurement results that may be gathered after the completion of the metal deposition process so that a corresponding correlation between one or more etch parameters and the resulting fill capability may be determined. To this end, the measurements are advantageously performed on the basis of electron microscopy to be able to reliably determine the characteristics of the trench 208 after having been filled with metal. Moreover, the measurements and the corresponding correlation established therefrom may also include, in some embodiments, one or more parameters of the electrochemical deposition process. For instance, one or more parameters, such as bath composition, electrical pulse sequence in the case of electroplating, and the like may be varied for a given set of etch parameters of the second etch process 219 to determine a desired combination of etch parameters for the process 219 and deposition parameters for the electrochemical deposition, while still obtaining a metal-filled trench with a number of defects that is compatible with specific process requirements. For instance, for a given technology node, the constraints for the subsequent electrochemical deposition process may be significantly relaxed owing to the additional trench edge rounding caused by the second etch process 219, thereby offering the potential for reducing process complexity.

FIG. 2f schematically shows the semiconductor device 200 after completion of the electrochemical deposition of a metal, such as copper or a copper alloy. Hence, the semiconductor device 200 comprises a metal layer 211 formed above a barrier layer 210, which may be comprised of any appropriate materials to provide the required adhesion and diffusion blocking characteristics.

The barrier layer 210 may be formed by sputter deposition, chemical vapor deposition, atomic layer deposition (ALD), etc., depending on the process requirements. Typically, the barrier layer 210 may be comprised of two or more sub-layers, such as a tantalum layer, tantalum nitride layer and the like, to thereby enhance the overall performance of the barrier layer 210. During the deposition of the barrier layer 210, the corner rounding at the upper portion 208a may also provide enhanced deposition behavior, since any overhang areas are less critical. Thereafter, a seed layer (not shown) is typically deposited, for instance by sputter deposition or electroless plating, wherein the tapered upper portion 208a may also enhance the fill capabilities. Thereafter, the bulk metal is deposited by electroplating or electroless plating, wherein the "bottom-to-top" fill behavior is significantly improved compared to the conventional process flow and hence the occurrence of any voids may significantly be suppressed or even completely be avoided. As previously explained, the electrochemical deposition of the bulk metal is a highly complex process and hence any improvement due to a reconfiguration of the upper portion 208a for the fill process may significantly relax corresponding constraints, while still providing superior fill capabilities. As explained above with reference to FIG. 2e, one or more semiconductor devices 200 as shown in FIG. 2f may be subjected to electron microscopy to estimate the quality of the metal-filled trench 208 and, as mentioned above, in some embodiments, to determine appropriate process parameters for the second etch process 219 and/or the electrochemical deposition process and/or the deposition processes for forming the barrier layer 210 and any seed layers.

Thereafter, the manufacturing process may be continued by removing the excess material of the layer 211 and 210 by chemical mechanical polishing, which may possibly be assisted by a preceding electrochemical removal of material of the layer 211. As previously explained, during the CMP process, a portion of the capping layer 220 is also removed to maintain the overall permittivity at a low level, wherein, in the embodiment shown, a portion of the sub-layer 204 acts as a CMP stop layer to provide the required mechanical stability of the layer 203 during the CMP process. Hence, after the material removal, the semiconductor device 200 comprises a trench 208 filled with metal, while a defect rate is significantly reduced compared to the conventional process flow, wherein a reduced layer 204a covers the low-k dielectric layer 203. Consequently, due to the significant reduction of irregularities in the metal-filled trench 208 due to the elimination of any voids or at least due to a significant reduction of the size and/or number of voids, the electrical performance of the metal-filled trench 208 is significantly enhanced, wherein the process flow described above provides the potential of further device scaling without the risk of loss of performance.

With reference to FIGS. 3a-3d, further illustrative embodiments of the present invention will now be described in more detail. FIG. 3a schematically shows a semiconductor device 300 comprising a substrate 301, a layer 302 formed thereon followed by a low-k dielectric layer 303. Moreover, a capping layer 320 is formed on the low-k dielectric layer 303 having formed therein an upper portion 308a of an opening to be formed in the low-k dielectric layer 303. A resist mask 307 is formed above the capping layer 320 and has an opening that corresponds to the upper portion 308a. Regarding the specifics of the substrate 301 and the layers 302, 303, 320, the same criteria apply as previously explained with reference to the respective components of the semiconductor device 200 or 100. Regarding the resist mask 307, in some embodiments, the resist mask may represent a resist material designed for a short exposure wavelength, such as 193 nm, wherein, in other embodiments, the resist mask 307 may be designed for longer exposure wavelength, such as 248 nm and the like. In the transition to shorter exposure wavelengths for advanced photolithography techniques, typically a thickness of the resist mask 307 may not be selected to a desired thickness as may be required for providing protection during the entire etch process through the layers 320 and 303. Thus, in some embodiments, the resist mask 307 is configured to at least ensure a reliable anisotropic etch process of the capping layer 320 to form the upper portion 308a. Thereafter, in one embodiment, the resist mask 307 may be removed, while, in other embodiments, the remainder of the resist mask 307 may be removed during the subsequent etch step for etching through the low-k dielectric layer 303.

FIG. 3b schematically shows the semiconductor device 300 after removal of the resist mask 307 and during an anisotropic etch process 309 for forming an opening in the low-k dielectric layer 303. The plasma ambient of the etch process 309 may be designed to exhibit a certain degree of selectivity between the material of the capping layer 320 and the material of the low-k dielectric layer 303. Hereby, well-established process recipes for etching through low-k dielectric materials may be used, as the capping layer 320 typically has a significantly higher density and thus a reduced removal rate for a plurality of etch recipes. During the anisotropic etch process 309, an enhanced corner rounding occurs at the upper portion 308a, since a surface 320a of the capping layer 320 is exposed to the plasma atmosphere at least during a predetermined time period during the etch process 309. In the embodiment shown, the surface 320a may be exposed during the entire etch process, while, in other embodiments, the resist mask may not be removed after the formation of the upper portion 308a and may be consumed during the etch process 309, thereby exposing the surface 320a at least during a final phase of the etch process.

FIG. 3c schematically shows the device 300 after the completion of the etch process 309, wherein an opening 308 is formed in the low-k dielectric layer 303. Moreover, during the process 309, material of the capping layer 320 may have been removed to form a capping layer 320b of reduced thickness, wherein the upper portion 308a of the opening 308 is significantly more rounded compared to an etch process with a resist mask maintained, as is described with reference to FIG. 1a. In some embodiments, the corner rounding achieved by the etch process 309 may be sufficient to enhance the fill capabilities of the subsequent electrochemical metal deposition and therefore the manufacturing process may be continued by forming a barrier layer, a seed layer and depositing the bulk metal. Regarding the process parameters for the etch process 309, for instance etch time, composition of plasma atmosphere and the like, the same criteria apply as previously explained with reference to FIG. 2e. That is, corresponding measurements may be performed to estimate the characteristics of the corner rounding of the upper portion 308a in relation to a corresponding variation of one or more process parameters of the etch process 309. Also, the finally obtained metal-filled trenches may be examined by electron microscopy to estimate the influence of one or more etch parameters and possibly of one or more deposition parameters on the quality of the finally obtained metal trench. In a further illustrative embodiment, the corner rounding or tapering at the upper portion 308a may be increased by an additional etch process.

FIG. 3d schematically shows the semiconductor device 300 during a second etch process 319 performed for creating an increased slope or an enhanced corner rounding at the upper portion 308a. For example, an angle α with respect to a direction 301a that is perpendicular to the surface of the substrate 301 may range from approximately 30-60 degrees. The second etch process 319 may be performed as a substantially anisotropic process with an appropriate plasma atmosphere to provide an increased removal rate for the capping layer 320b. In other embodiments, the etch process 319 may be designed as a substantially isotropic process based on an appropriate plasma atmosphere, wherein the duration of the etch process 319 is selected so as to not unduly affect the opening 308. In one particular embodiment, the etch process 319 may be performed on the basis of a plasma containing argon, oxygen and $CHF_3$. Thereafter, the further processing may be continued as is described with reference to FIG. 2f.

As a result, the present invention provides a technique that enables the formation of metal lines of improved reliability, since the deposition of metal into a corresponding trench according to a single damascene technique is significantly enhanced by tapering an upper portion of the trench.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a low-k dielectric layer for a metallization layer of a semiconductor device above a substrate;
   forming a capping layer on said low-k dielectric layer;
   forming an opening in said capping layer through a surface thereof;
   performing an etch process to etch said low-k dielectric layer through said opening, said surface being exposed at least for a specified time period during said etch process to reduce a thickness of said capping layer and to round corners of said opening formed in said reduced thickness capping layer; and performing a second etch process for further rounding corners of said opening.

2. The method of claim 1, wherein forming said capping layer comprises forming a resist mask on said capping layer and etching said capping layer through an opening of said resist mask.

3. The method of claim 2, wherein forming said resist mask comprises forming said resist mask with a predetermined thickness, said predetermined thickness being consumed during said etch process to expose said capping layer.

4. The method of claim 2, further comprising removing said resist mask prior to performing said etch process.

5. The method of claim 1, further comprising performing a second etch process with at least one different process parameter compared to said etch process to round at least an upper edge of said opening.

6. The method of claim 5, wherein said second etch process comprises a plasma etch process.

7. The method of claim 6, wherein said plasma etch process is performed on the basis of a plasma containing argon, oxygen and $CHF_3$.

8. The method of claim 4, wherein said capping layer is formed to act as an anti-reflective coating layer for a specified exposure wavelength.

9. The method of claim 8, wherein forming said capping layer comprises forming a first sub-layer on said low-k dielectric layer and forming an anti-reflective coating sub-layer above said first sub-layer.

10. The method of claim 9, wherein forming said capping layer further comprises forming a second sub-layer above said anti-reflective coating sub-layer.

11. The method of claim 1, further comprising determining a correlation between a degree of corner rounding and at least one process parameter of said etch process, determining a setting value for said etch process based on said correlation and using said setting value for said etch process for a plurality of substrates other than said substrate.

* * * * *